(12) United States Patent
Kuo et al.

(10) Patent No.: US 7,902,562 B2
(45) Date of Patent: Mar. 8, 2011

(54) LIGHT EMITTING DIODE DEVICE THAT INCLUDES A THREE DIMENSIONAL CLOUD STRUCTURE AND MANUFACTURING METHOD THEREOF

(75) Inventors: Cheng-Ta Kuo, Hsinchu (TW); Yu-Pin Hsu, Hsinchu (TW); Chun-Kai Wang, Hsinchu (TW); Jui-Yi Chu, Hsinchu (TW); Tsung-Kuang Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 263 days.

(21) Appl. No.: 12/222,814

(22) Filed: Aug. 18, 2008

(65) Prior Publication Data
US 2009/0057696 A1 Mar. 5, 2009

(30) Foreign Application Priority Data
Aug. 17, 2007 (TW) ............................. 96130660 A

(51) Int. Cl.
*H01L 33/32* (2010.01)

(52) U.S. Cl. ..... 257/94; 257/103; 257/196; 257/E33.034
(58) Field of Classification Search .................. 257/196, 257/E33.027, E33.028, E33.034
See application file for complete search history.

(56) References Cited

U.S. PATENT DOCUMENTS

| 6,121,638 | A | * | 9/2000 | Rennie et al. | ................. 257/103 |
| 6,608,328 | B2 | * | 8/2003 | Kuo et al. | ....................... 257/79 |
| 6,631,149 | B1 | * | 10/2003 | Tezen et al. | .............. 372/45.012 |

* cited by examiner

*Primary Examiner* — Stephen W Smoot
(74) *Attorney, Agent, or Firm* — Bacon & Thomas, PLLC

(57) ABSTRACT

A light-emitting diode device (LED) device and manufacturing methods thereof are provided, wherein the LED device comprises a substrate, a first n-type semiconductor layer, an n-type three-dimensional electron cloud structure, a second n-type semiconductor layer, an active layer and a p-type semiconductor layer. The first n-type semiconductor layer, the n-type three-dimensional electron cloud structure, the second n-type semiconductor layer, the active layer and the p-type semiconductor layer are subsequently grown on the substrate.

14 Claims, 14 Drawing Sheets

LIGHT EMITTING DIODE DEVICE THAT INCLUDES A THREE DIMENSIONAL CLOUD STRUCTURE AND MANUFACTURING METHOD THEREOF

BACKGROUND

1. Technical Field

A light-emitting diode (LED) device and manufacturing methods thereof are provided, and more particularly to a LED device having a three-dimensional electron cloud structure and/or a three-dimensional hole cloud structure and manufacturing methods thereof.

2. Reference to Related Application

This application claims the right of priority based on TW application Ser. No. 096130660, filed Aug. 17, 2007, entitled "LIGHT-EMITTING DIODE DEVICE AND MANUFACTURING METHOD THEREOF", and the contents of which are incorporated herein by reference.

3. Description of the Related Art

The light-emitting diodes (LEDs) of the solid-state lighting elements having the characteristics of low power consumption, low heat generation, long operational life, shockproof, small volume, quick response and good opto-electrical property like emitting stable wavelength and so on, so that the LEDs have been widely used in household appliances, indicator light of instruments, optics and photonics products, etc. As the optics and photonics technology develops, the solid-state lighting elements have great progress in increasing the light efficiency, operation life and the brightness. LEDs become the main stream of the lighting devices in the near future.

FIG. 1 shows a cross-sectional view of conventional light-emitting diode device 100. The conventional light-emitting diode device includes a substrate 101, an n-type semiconductor layer 102 epitaxially grown on the substrate 101, an active layer 103, a p-type semiconductor layer 104, a front side electrode 105 and a back side electrode 106 wherein the front side electrode 105 is disposed on the light extraction side of the light-emitting diode device 100 and the back side electrode 106 is formed on the side of the substrate 101 where no epitaxial structure formed on. The driving current R1 is driven from the front side electrode 105 to the p-type semiconductor layer 104, and through the active layer 103 having a double heterostructure or a multiquantum well to emit light. Generally speaking, in order to improve the light efficiency of the light-emitting diode device 100, the current from the front side electrode 105 needs to be spread to the edge of the light-emitting diode device 100 effectively to make the active layer 103 emitting light uniformly.

Because of the high contact resistance between the semiconductor layer and the metal electrode of the light-emitting diode device 100, the current R1 cannot spread to the active layer 103 effectively. The current R1 will flow with the shortest pathway passing through the active layer 103 to the back side electrode 106 and the current crowding effect is therefore occurred. It makes the lighting area limited in a portion of the active layer 103 below the front side electrode 105, and greatly influences the light efficiency of the active layer 103.

In order to solve the issue described above, a conventional technique is to form a layer on the most top layer of the epitaxial stack in the light-emitting diode device 100, wherein the layer can be a window layer with low electrical resistance, a current blocking layer or a transparent electrode layer formed by ITO to make the current R1 spread uniformly from the front side electrode 105. The current can also be spread by changing the structure or the layout of the front side electrode 105, and the light efficiency of the light-emitting diode device 100 is therefore enhanced.

However, additional process steps are required no matter what techniques are adopted. Thus the manufacturing cost is increased, the LED quality is damaged, and the yield is decreased.

Therefore, a light-emitting diode having efficient current spreading and better light efficiency with simpler processes is needed.

SUMMARY

A light-emitting diode device is disclosed including a growth substrate, a first n-type semiconductor layer, an n-type three-dimensional electron cloud structure, a second n-type semiconductor layer, an active layer and a p-type semiconductor layer. The first n-type semiconductor layer is disposed on the growth substrate; the n-type three-dimensional electron cloud structure is disposed on the first n-type semiconductor layer; the second n-type semiconductor layer is disposed on the n-type three-dimensional electron cloud structure; the active layer is disposed on the second n-type semiconductor layer and the p-type semiconductor layer is disposed on the active layer.

A manufacturing process of the light-emitting diode device is disclosed wherein the process including providing a growth substrate, forming a first n-type semiconductor layer on the growth substrate; forming an n-type three-dimensional electron cloud structure on the first n-type semiconductor layer; forming a second n-type semiconductor layer on the n-type three-dimensional electron cloud structure; forming an active layer on the second n-type semiconductor layer and forming a p-type semiconductor layer on the active layer.

A light-emitting diode device structure is disclosed and including a growth substrate, a first n-type semiconductor layer, an n-type three-dimensional electron cloud structure, a second n-type semiconductor layer, an active layer, a p-type semiconductor layer, a p-type three-dimensional hole cloud structure and a second p-type semiconductor layer. The first n-type semiconductor layer is disposed on the growth substrate; the n-type three-dimensional electron cloud structure is disposed on the first n-type semiconductor layer; the second n-type semiconductor layer is disposed on the n-type three-dimensional electron cloud structure; the active layer is disposed on the second n-type semiconductor layer; the first p-type semiconductor layer is disposed on the active layer; the p-type three-dimensional hole cloud structure is disposed on the first p-type semiconductor layer and the second p-type semiconductor layer is disposed on the p-type three-dimensional hole cloud structure.

A manufacturing process of the light-emitting diode device is disclosed wherein the processes including providing an growth substrate, forming a first n-type semiconductor layer on the growth substrate; forming an n-type three-dimensional electron cloud structure on the first n-type semiconductor layer; forming a second n-type semiconductor layer on the n-type three-dimensional electron cloud structure; forming an active layer on the second n-type semiconductor layer; forming a first p-type semiconductor layer on the active layer; forming a p-type three-dimensional hole cloud structure on the first p-type semiconductor layer and forming a second p-type semiconductor layer on the p-type three-dimensional hole cloud structure.

A light-emitting diode device structure is disclosed and including a growth substrate, an n-type semiconductor layer, an active layer, a first p-type semiconductor layer, a p-type three-dimensional hole cloud structure, and a second p-type semiconductor layer. The n-type semiconductor layer is disposed on the growth substrate; the active layer is disposed on the n-type semiconductor layer; the first p-type semiconductor layer is disposed on the active layer; the p-type three-dimensional hole cloud structure is disposed on the first p-type semiconductor layer and the second p-type semiconductor layer is disposed on the p-type three-dimensional hole cloud structure.

Another embodiment of this invention, a manufacturing process of the light-emitting diode device is disclosed wherein the processes including providing an growth substrate, an n-type semiconductor layer is formed on the growth substrate; forming an active layer on the n-type semiconductor layer; forming a first p-type semiconductor layer on the active layer; forming a p-type three-dimensional hole cloud structure on the first p-type semiconductor layer and forming a second p-type semiconductor layer on the p-type three-dimensional hole cloud structure.

The p-type three-dimensional hole cloud structure or an n-type three-dimensional electron cloud structure contains at least a wide bandgap material layer and a narrow bandgap material layer in the p-type or the n-type semiconductor layer in the light-emitting diode device. Because the wide bandgap material layer and the narrow bandgap material layer are composed of the group III and V nitride compounds, it has the characteristic of high carrier mobility and high carrier concentration to drive the current from the front side electrode to the active layer uniformly to solve the issue of current crowding effect in the light-emitting diode device. The present invention therefore has the advantages of better light efficiency with simpler processes.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1:
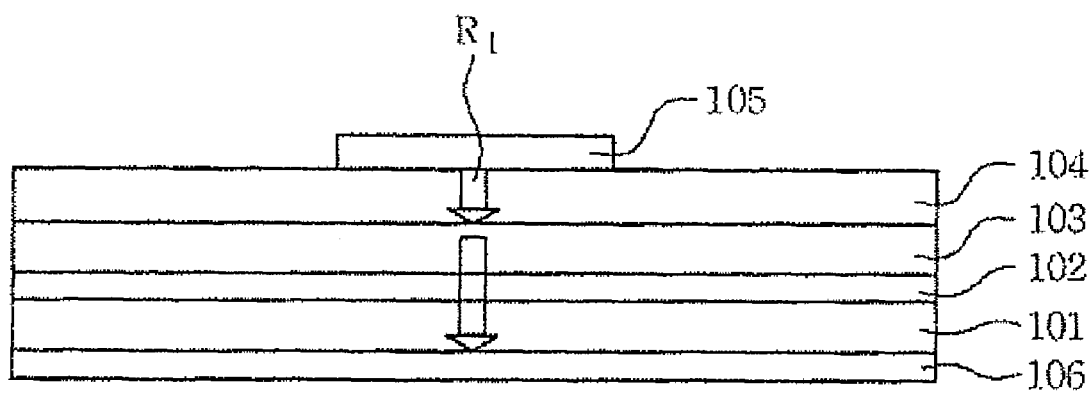
FIG. 1 shows a cross-sectional view of conventional light-emitting diode 100.

Reference is made in detail to the preferred embodiments of the present invention, examples of which are illustrated in the accompanying drawings. Wherever possible, the same reference numbers are used in the drawings and the description to refer to the same or like parts.

Figure 2A:
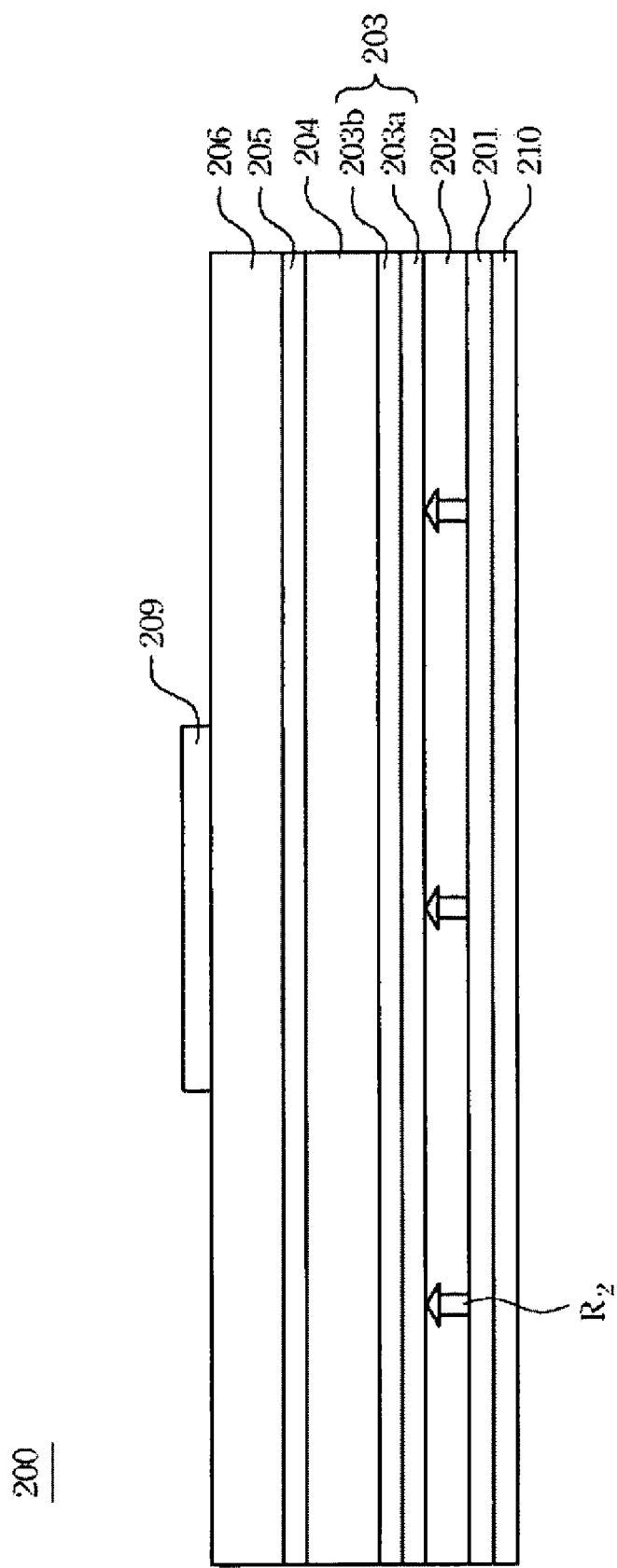
FIG. 2A shows a cross-sectional view of the light-emitting diode device 200 in accordance with a first embodiment of the present invention.
Figure 2B:
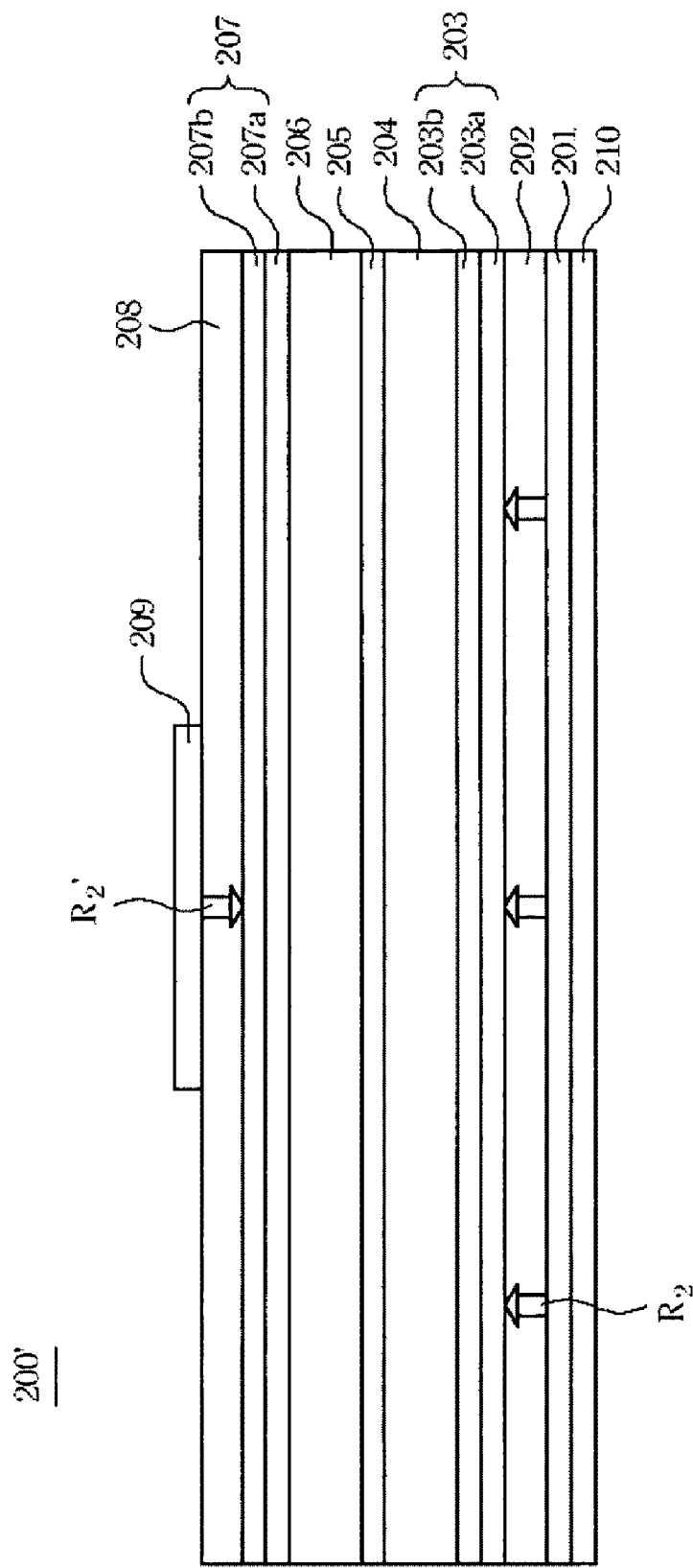
FIG. 2B shows a cross-sectional view of the light-emitting diode device 200' in accordance with a second embodiment of the present invention.

Referring to FIGS. 2A and 2B, FIG. 2A shows a cross-sectional view of the light-emitting diode device 200 in accordance with a first embodiment of the present invention. FIG. 2B shows a cross-sectional view of the light-emitting diode device 200' in accordance with a second embodiment of the present invention.

A growth substrate 201 such as sapphire, SiC, Si, ZnO, MgO, AlN, GaN or the combinations thereof is provided. A first n-type semiconductor layer 202 is formed on the growth substrate 201 by metal-organic chemical vapor deposition (MOCVD) process wherein the material to form the first n-type semiconductor layer 202 is n-type AlInGaN or n-type GaN.

An n-type three-dimensional electron cloud structure 203 is formed on the first n-type semiconductor layer 202, wherein the material to form the n-type three-dimensional electron cloud structure 203 is different from the n-type semiconductor layer 202, and its structure can be a single heterojunction structure, double heterojunction structure or multi-layer structure with different bandgaps.

The n-type three-dimensional electron cloud structure 203 includes a wide bandgap material layer 203a and a narrow bandgap material layer 203b, wherein at least one of them has n-type doping. In a preferred embodiment, the n-type three-dimensional electron cloud structure 203 is a double heterojunction structure formed by two heterostructure n-type AlInGaN layers, such as an n-type $Al_xIn_yGa_{1-x-y}N$ (0<x<1, 0<y<1) layer and an n-type $Al_aIn_bGa_{1-a-b}N$ (0<a<1, 0<b<1) layer, The bandgap of the n-type $Al_xIn_yGa_{1-x-y}N$ layer is larger than the bandgap of the n-type $Al_aIn_bGa_{1-a-b}N$ layer. In this embodiment, the thickness of the n-type wide bandgap layer $Al_xIn_yGa_{1-x-y}N$ or the n-type narrow bandgap layer $Al_aIn_bGa_{1-a-b}N$ is between 1 nm to 1000 nm.

A second n-type semiconductor layer 204 is formed on the n-type three-dimensional electron cloud structure 203. In the embodiment, the material of the second n-type semiconductor layer 204 is substantially the same as the material of the first n-type semiconductor layer 202.

Next, an active layer 205 is epitaxially grown on the second n-type semiconductor layer 204, wherein the active layer 205 is a multi-quantum well (MQW) structure formed by AlInGaN or GaN. A first p-type semiconductor layer 206 is epitaxially grown on the active layer 205. A first metal electrode 209 is formed on the first p-type semiconductor layer 206. A second metal electrode 210 is formed on the surface of the growth substrate 201 away from the epitaxial structure to complete the process of the light-emitting diode device 200.

Another embodiment of this invention, a p-type three-dimensional hole cloud structure 207 and a second p-type semiconductor layer 208 is formed on the first p-type semiconductor layer 206 of the light-emitting diode device 200. Referring to FIG. 2B, the structure of a light-emitting diode device 200' is approximately the same with the structure of the light-emitting diode device 200 in FIG. 2A. The difference is the light-emitting diode device 200' further including a p-type three-dimensional hole cloud structure 207 formed on the first p-type semiconductor layer 206, and a second p-type semiconductor layer 208 formed on the p-type three-dimensional hole cloud structure 207. A first metal electrode 209 is formed on the second p-type semiconductor layer 208 and a second metal electrode 210 is formed on the surface of the growth substrate 201 away from the epitaxial structure.

The material of the p-type three-dimensional hole cloud structure 207 is different from the material of the first p-type semiconductor 206, and its structure can be a single heterojunction structure, double heterojunction structure or multi-layer structure with different bandgaps. The material of the p-type three-dimensional hole cloud structure 207 includes a wide bandgap material layer 207a and a narrow bandgap material layer 207b, wherein at least one of them has p-type doping. The p-type three-dimensional hole cloud structure 207 is a double heterojunction structure formed by two heterostructure p-type AlInGaN layers, such as a p-type $Al_xIn_yGa_{1-x-y}N$ (0<x<1, 0<y<1) layer and a p-type $Al_aIn_bGa_{1-a-b}N$ (0<a<1, 0<b<1) layer. The bandgap of the p-type $Al_xIn_yGa_{1-x-y}N$ layer is larger than the bandgap of the p-type $Al_aIn_bGa_{1-a-b}N$ layer. In this embodiment, the thickness of the p-type wide bandgap layer $Al_xIn_yGa_{1-x-y}N$ or the p-type narrow bandgap layer $Al_aIn_bGa_{1-a-b}N$ is between 1 nm to 1000 nm.

Because the n-type three-dimensional electron cloud structure and the p-type three-dimensional hole cloud structure have plurality of heterojunction structures with different bandgaps in the light-emitting diode device 200 and 200', it makes the band bending and the energy splitting under carrier quantization effect in the interface of the wide bandgap material layer and the narrow bandgap material layer. By using the characteristics of high carrier mobility and high carrier concentration in the light-emitting diode device, it can drive the current R2 or R2' from the first metal electrode 209 or the second metal electrode 210 efficiently to the active layer of the light-emitting diode device uniformly.

Figure 3:
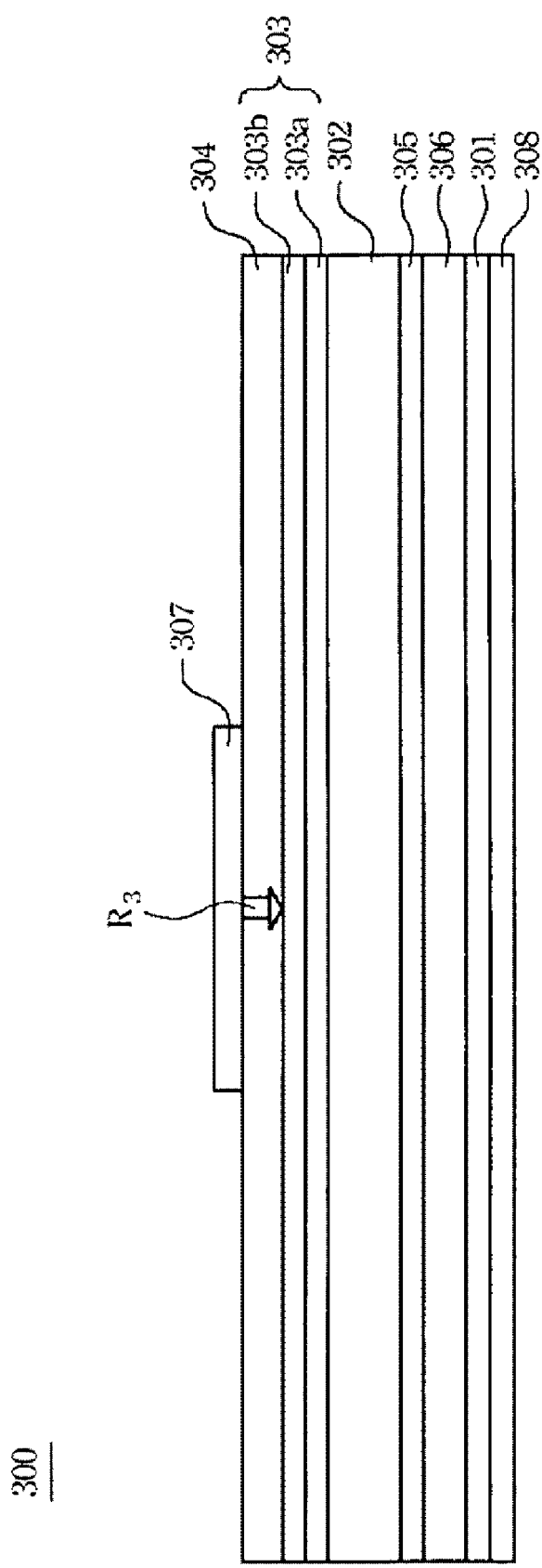
FIG. 3 shows a cross-sectional view of the light-emitting diode device 300 in accordance with a third embodiment of the present invention.

Referring to FIG. 3 shows a cross-sectional view of the light-emitting diode device 300 in accordance with a third embodiment of the present invention. A growth substrate 301 such as sapphire, SiC, Si, ZnO, MgO, AlN, GaN or the combinations thereof is provided. An n-type semiconductor layer 306 is formed on the growth substrate 301 by metal-organic chemical vapor deposition (MOCVD) process wherein the material to form the n-type semiconductor layer 306 is n-type AlInGaN or n-type GaN. An active layer 305 is epitaxially grown on the n-type semiconductor layer 306, wherein the active layer 305 is a multi-quantum well (MQW) structure formed by AlInGaN or GaN. A first p-type semiconductor layer 302 is epitaxially grown on the active layer 305 wherein the material of the first p-type semiconductor layer 302 is p-type AlInGaN or p-type GaN. A p-type three-dimensional hole cloud structure 303 is formed on the first p-type semiconductor layer 302. In this embodiment, the material of the p-type three-dimensional hole cloud structure 303 is different from the first p-type semiconductor 302, and its structure can be a single heterojunction structure, double heterojunction structure or multi-layer structure with different bandgaps. The material of the p-type three-dimensional hole cloud structure 303 includes a wide bandgap material layer 303a and a narrow bandgap material layer 303b, wherein at least one of them has p-type doping. The p-type three-dimensional hole cloud structure 303 is a double heterojunction structure formed by two heterostructure p-type AlInGaN layers, such as a p-type $Al_xIn_yGa_{1-x-y}N$ (0<x<1, 0<y<1) layer and a p-type $Al_aIn_bGa_{1-a-b}N$ (0<a<1, 0<b<1) layer. The bandgap of the p-type $Al_xIn_yGa_{1-x-y}N$ layer is larger than the bandgap of the p-type $Al_aIn_bGa_{1-a-b}N$ layer. In this embodiment, the thickness of the p-type wide bandgap layer $Al_xIn_yGa_{1-x-y}N$ or the p-type narrow bandgap layer $Al_aIn_bGa_{1-a-b}N$ is between 1 nm to 1000 nm.

A second p-type semiconductor layer 304 is formed on the p-type three-dimensional hole cloud structure 303. In this embodiment, the material of the second p-type semiconductor layer 304 is substantially the same as the material of the first p-type semiconductor layer 302.

A first metal electrode 307 is formed on the second p-type semiconductor layer 304. A second metal electrode 308 is formed on the surface of the growth substrate 301 away from the epitaxial structure to complete the process of the light-emitting diode device 300.

Because the p-type three-dimensional hole cloud structure 303 has plurality of heterojunction structures with different bandgaps, it makes the band bending and the energy splitting under carrier quantization effect in the interface of the wide bandgap material layer and the narrow bandgap material layer. By using the characteristics of high carrier mobility and high carrier concentration in the light-emitting diode device, it can drive the current R3 from the metal electrode 308 to the active layer of the light-emitting diode device uniformly.

Figure 4A:
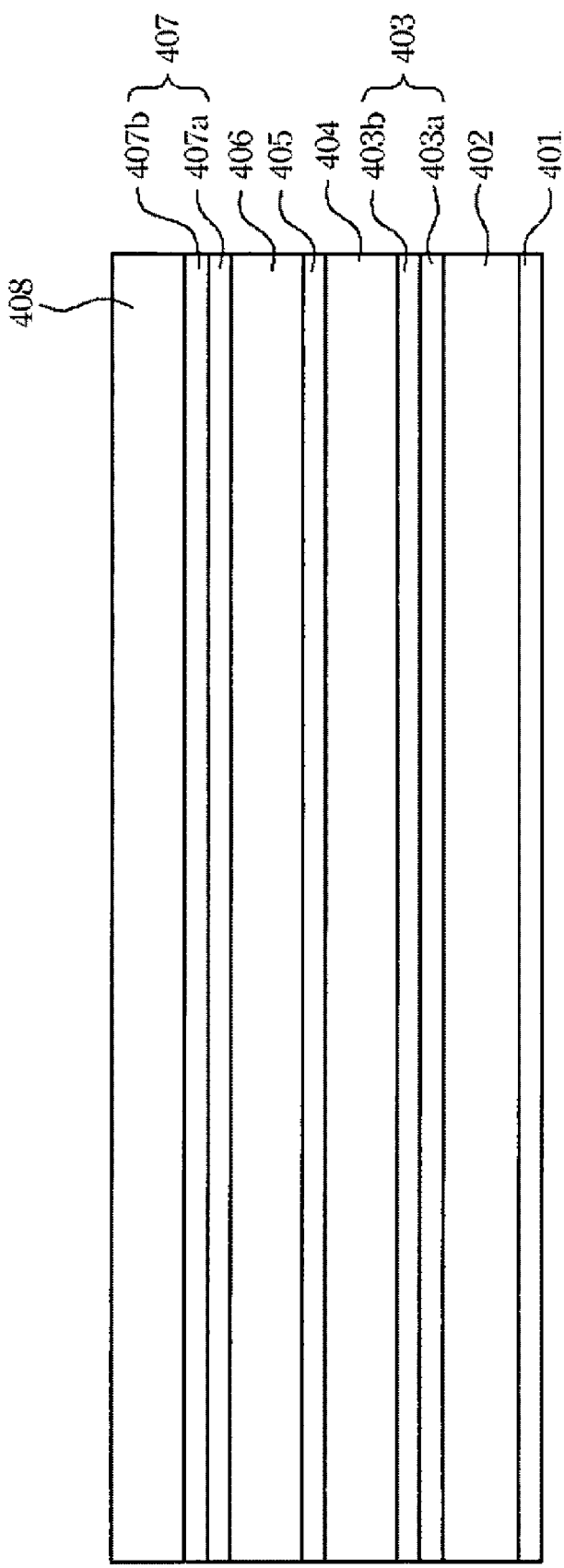
FIGS. 4A-4C show cross-sectional views of the light-emitting diode device 400 in accordance with the process of a fourth embodiment of the present invention.
Figure 4B:
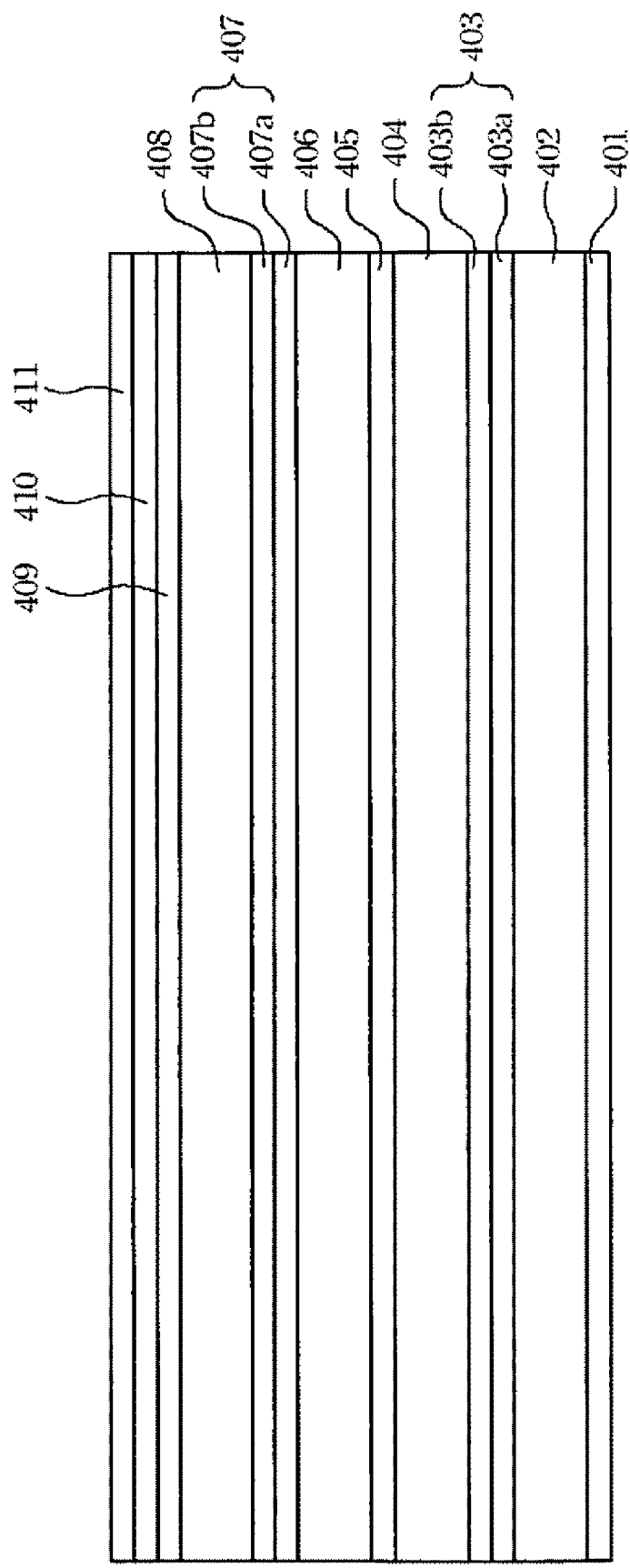
Figure 4C:
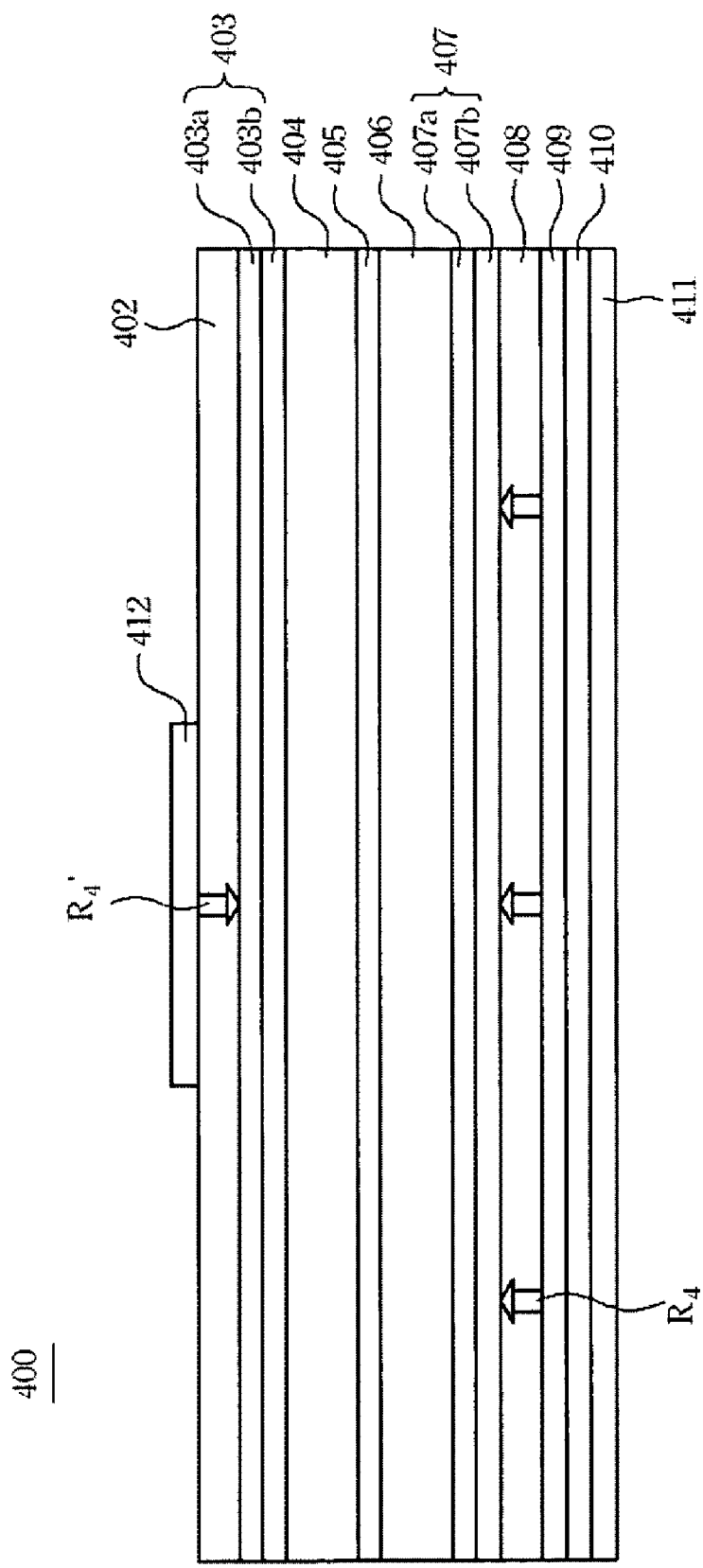

FIGS. 4A-4C show cross-sectional views of the light-emitting diode device 400 in accordance with the process of a fourth embodiment of the present invention. Referring to FIG. 4A, a growth substrate 401 such as sapphire, SiC, Si, ZnO, MgO, AlN, GaN or the combinations thereof is provided. A first n-type semiconductor layer 402 is formed on the growth substrate 401 by metal-organic chemical vapor deposition (MOCVD) process wherein the material to form the first n-type semiconductor layer is n-type AlInGaN or n-type GaN.

An n-type three-dimensional electron cloud structure 403 is formed on the first n-type semiconductor layer 402, wherein the material to form the n-type three-dimensional electron cloud structure 403 is different from the n-type semiconductor layer 402, and its structure can be a single heterojunction structure, double heterojunction structure or multi-layer structure with different bandgaps. The n-type three-dimensional electron cloud structure 403 includes a wide bandgap material layer 403a and a narrow bandgap material layer 403b, wherein at least one of them has n-type doping. The n-type three-dimensional electron cloud structure 403 is a double heterojunction structure formed by two heterostructure n-type AlInGaN layers, such as n-type $Al_xIn_yGa_{1-x-y}N$ (0<x<1, 0<y<1) layer and an n-type $Al_aIn_bGa_{1-a-b}N$ (0<a<1, 0<b<1) layer. The bandgap of the n-type $Al_xIn_yGa_{1-x-y}N$ layer is larger than the bandgap of the n-type $Al_aIn_bGa_{1-a-b}N$ layer. In this embodiment, the thickness of the n-type wide bandgap layer $Al_xIn_yGa_{1-x-y}N$ or the n-type narrow bandgap layer $Al_aIn_bGa_{1-a-b}N$ is between 1 nm to 1000 nm.

A second n-type semiconductor layer 404 is formed on the n-type three-dimensional electron cloud structure 403. In this embodiment, the material of the second n-type semiconductor layer 404 is substantially the same as the first n-type semiconductor layer 402. An active layer 405 is epitaxially grown on the second n-type semiconductor layer 404, wherein the active layer 405 is a multi-quantum well (MQW) structure formed by AlInGaN or GaN. A first p-type semiconductor layer 406 is epitaxially grown on the active layer 405. A p-type three-dimensional hole cloud structure 407 is formed on the first p-type semiconductor layer 406. A second p-type semiconductor layer 408 is formed on the p-type three-dimensional hole cloud structure 407.

In this embodiment, the material to form the p-type three-dimensional hole cloud structure 407 is a double heterojunction structure formed by two heterostructure p-type AlInGaN layers, such as a p-type $Al_xIn_yGa_{1-x-y}N$ (0<x<1, 0<y<1) layer and a p-type $Al_aIn_bGa_{1-a-b}N$ (0<a<1, 0<b<1) layer. The bandgap of the p-type $Al_xIn_yGa_{1-x-y}N$ layer is larger than the bandgap of the p-type $Al_aIn_bGa_{1-a-b}N$ layer. In this embodiment, the thickness of the p-type wide bandgap layer $Al_xIn_yGa_{1-x-y}N$ 407a or the p-type narrow bandgap layer $Al_aIn_bGa_{1-a-b}N$ 407b is between 1 nm to 1000 nm. The material to form the first p-type semiconductor layer 406 is p-type AlInGaN or p-type GaN. The material to form the second p-type semiconductor layer 408 is substantially the same as the first p-type semiconductor layer 406.

Referring to FIG. 4B, a reflecting layer 409 is formed on the second p-type semiconductor layer 408 wherein the material of the reflecting layer is made of Al, Au, Pt, Zn, Ag, Ni, Ge, In, Sn or the combinations thereof; a connecting layer 410 is formed on the reflecting layer 409 wherein the material of the connecting layer is made of silver epoxy, spontaneous conductive polymer, high polymer material with conductive material doping, Al, Au, Pt, Zn, Ag, Ni, Ge, In, Sn, Ti, Pb, Cu, Pd or the combinations thereof. A permanent substrate 411 is provided wherein the material is made of SiC, silicon, ZnO, GaN, metal or the combinations thereof. The permanent substrate 411 and the reflecting layer 409 are connected by the connecting layer 410. In this embodiment, the permanent substrate 411 is a metal substrate, and it can be the metal electrode of the light-emitting diode device 400.

Referring to FIG. 4C, after the removal of the growth substrate 401, another metal electrode 412 is formed on the first n-type semiconductor layer 402 to complete the process of the light-emitting diode device 400.

Because the n-type three-dimensional electron cloud structure 403 and the p-type three-dimensional hole cloud structure 407 have plurality of heterojunction structures with different bandgaps, it makes the band bending and the energy splitting under carrier quantization effect in the interface of the wide bandgap material layer and the narrow bandgap material layer. By using the characteristics of high carrier mobility and high carrier concentration in the light-emitting diode device, it can drive the current R4 or R4' from the permanent substrate 411 or the metal electrode 412 to the active layer of the light-emitting diode device uniformly.

Figure 5A:
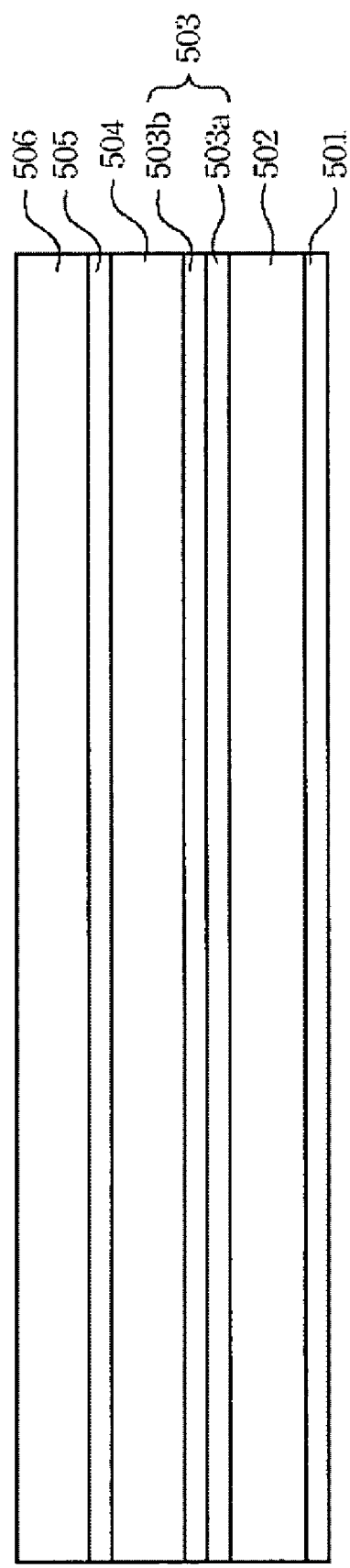
FIGS. 5A-5C show cross-sectional views of the light-emitting diode device 500 in accordance with the process of a fifth embodiment of the present invention.
Figure 5B:
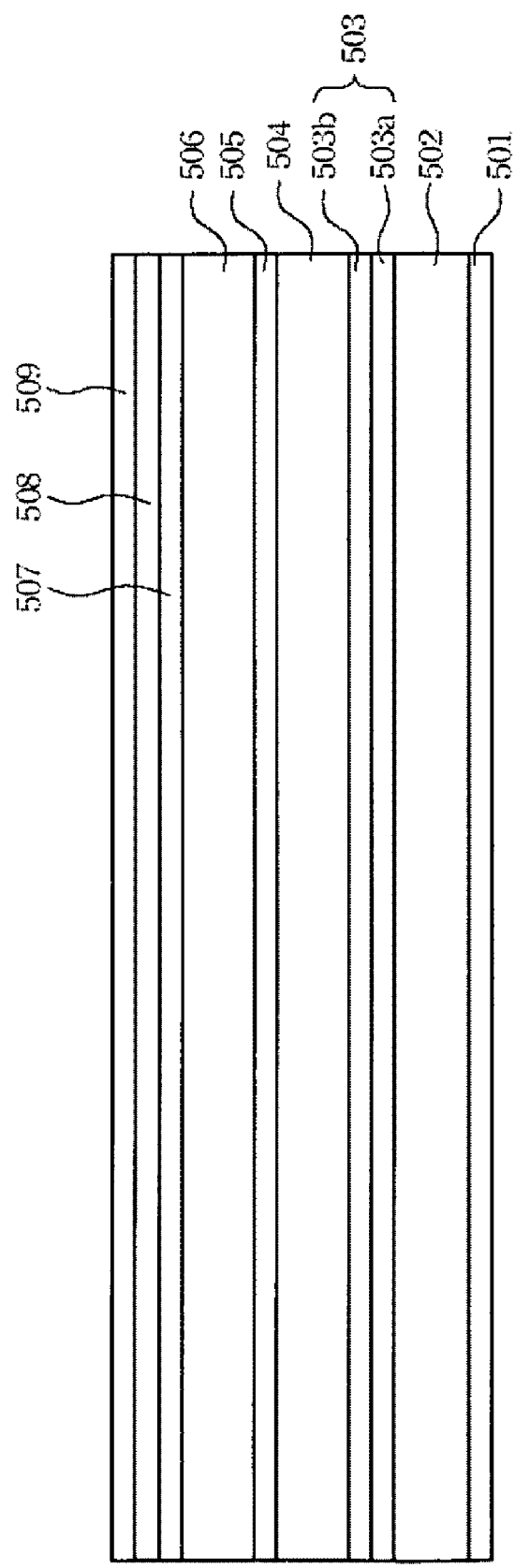
Figure 5C:
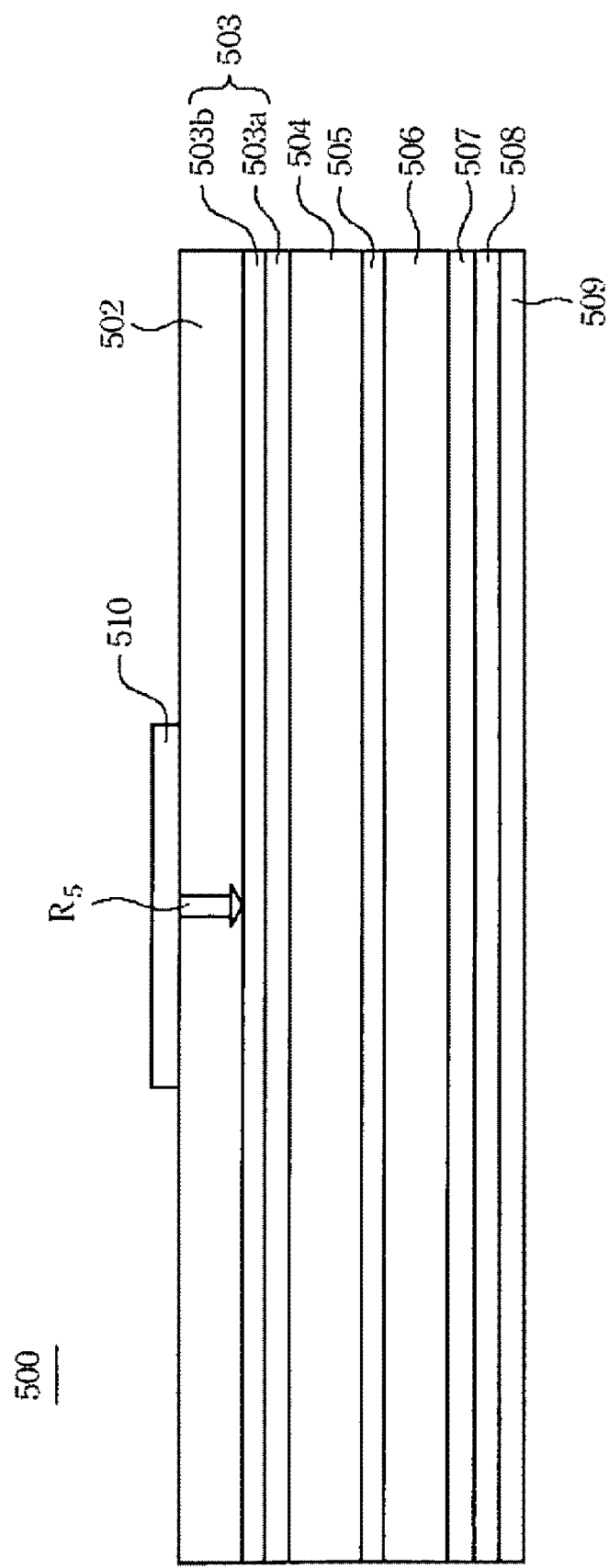

FIGS. 5A-5C show cross-sectional views of the light-emitting diode device 500 in accordance with the process of a fourth embodiment of the present invention. Referring to FIG. 5A, an growth substrate 501 such as sapphire, SiC, Si, ZnO, MgO, AlN, GaN or the combinations thereof is provided. A first n-type semiconductor layer 502 is formed on the growth substrate 501 by metal-organic chemical vapor deposition (MOCVD) process wherein the material to form the first n-type semiconductor layer is n-type AlInGaN or n-type GaN.

An n-type three-dimensional electron cloud structure 503 is formed on the first n-type semiconductor layer 502, wherein the material to form the n-type three-dimensional electron cloud structure 503 is different from the n-type semiconductor layer 502, and its structure can be a single heterojunction structure, double heterojunction structure or multi-layer structure with different bandgaps. The n-type three-dimensional electron cloud structure 503 includes a wide bandgap material layer 503*a* and a narrow bandgap material layer 503*b*, wherein at least one of them has n-type doping. The n-type three-dimensional electron cloud structure 503 is a double heterojunction structure formed by two heterostructure n-type AlInGaN layers, such as a n-type $Al_xIn_yGa_{1-x-y}N$ ($0<x<1$, $0<y<1$) layer and n-type $Al_aIn_bGa_{1-a-b}N$ ($<a<1$, $0<b<1$) layer. The bandgap of the n-type $Al_xIn_yGa_{1-x-y}N$ layer is larger than the bandgap of the n-type $Al_aIn_bGa_{1-a-b}N$ layer. In this embodiment, the thickness of the n-type wide bandgap layer $Al_xIn_yGa_{1-x-y}N$ or the n-type narrow bandgap layer $Al_aIn_bGa_{1-a-b}N$ is between 1 nm to 1000 nm.

A second n-type semiconductor layer 504 is formed on the n-type three-dimensional electron cloud stricture 503. In this embodiment, the material of the second n-type semiconductor layer 504 is substantially the same as the material of the first n-type semiconductor layer 502. An active layer 505 is epitaxially grown on the second n-type semiconductor layer 504, wherein the active layer 505 is a multi-quantum well (MQW) structure formed by AlInGaN or GaN. A p-type semiconductor layer 506 is epitaxially grown on the active layer 505. The material to form the p-type semiconductor layer 506 is p-type AlInGaN or p-type GaN.

Referring to FIG. 5B, a reflecting layer 507 is formed on the p-type semiconductor layer 506 wherein the material of the reflecting layer is made of Al, Au, Pt, Zn, Ag, Ni, Ge, In, Sn or the combinations thereof; a connecting layer 508 is formed on the reflecting layer 507 wherein the material of the connecting layer is made of silver epoxy, spontaneous conductive polymer, high polymer material with conductive material doping, Al, Au, Pt, Zn, Ag, Ni, Ge, In, Sn, Ti, Pb, Cu, Pd or the combinations thereof. A permanent substrate 509 is provided wherein the material is made of SiC, silicon, ZnO, GaN, metal or the combinations thereof. The permanent substrate 509 and the reflecting layer 507 are connected by the connecting layer 508. In this embodiment, the permanent substrate 509 is a metal substrate, and it can be the metal electrode of the light-emitting diode device 500.

Referring to FIG. 5C, after the removal of the growth substrate 501, another metal electrode 510 is formed on the first n-type semiconductor layer 502 to complete the process of the light-emitting diode device 500.

Because the n-type three-dimensional electron cloud structure 503 has plurality heterojunction structures with different bandgaps, it makes the band bending and the energy splitting under carrier quantization effect in the interface of the wide bandgap material layer and the narrow bandgap material layer. By using the characteristics of high carrier mobility and high carrier concentration in the light-emitting diode device, it can drive the current R5 from the metal electrode 510 to the active layer of the light-emitting diode device uniformly.

Figure 6A:
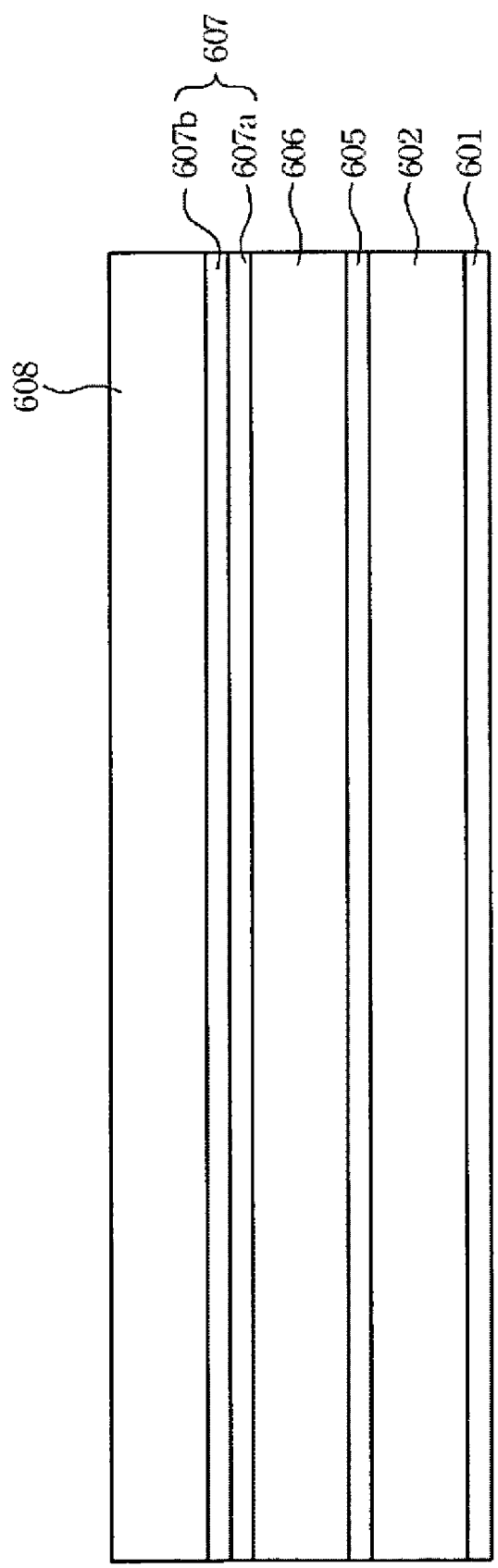
FIGS. 6A-6C show cross-sectional views of the light-emitting diode device 600 in accordance with the process of a sixth embodiment of the present invention.
Figure 6B:
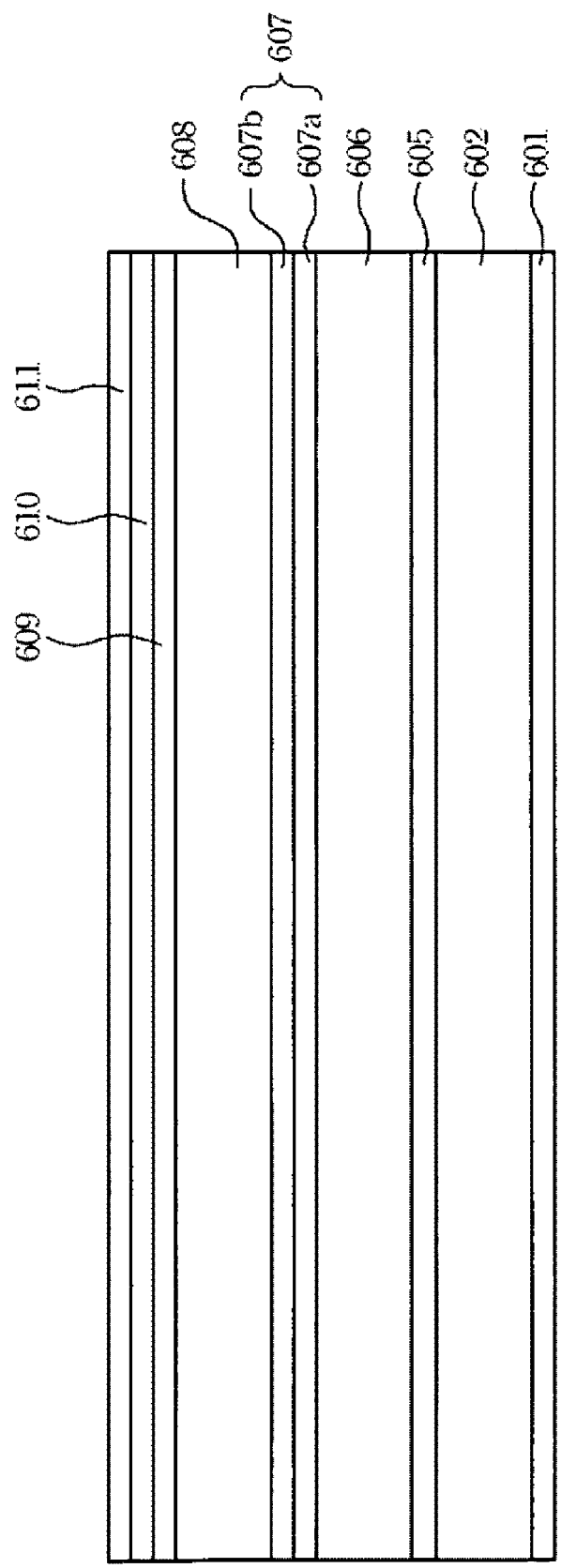
Figure 6C:
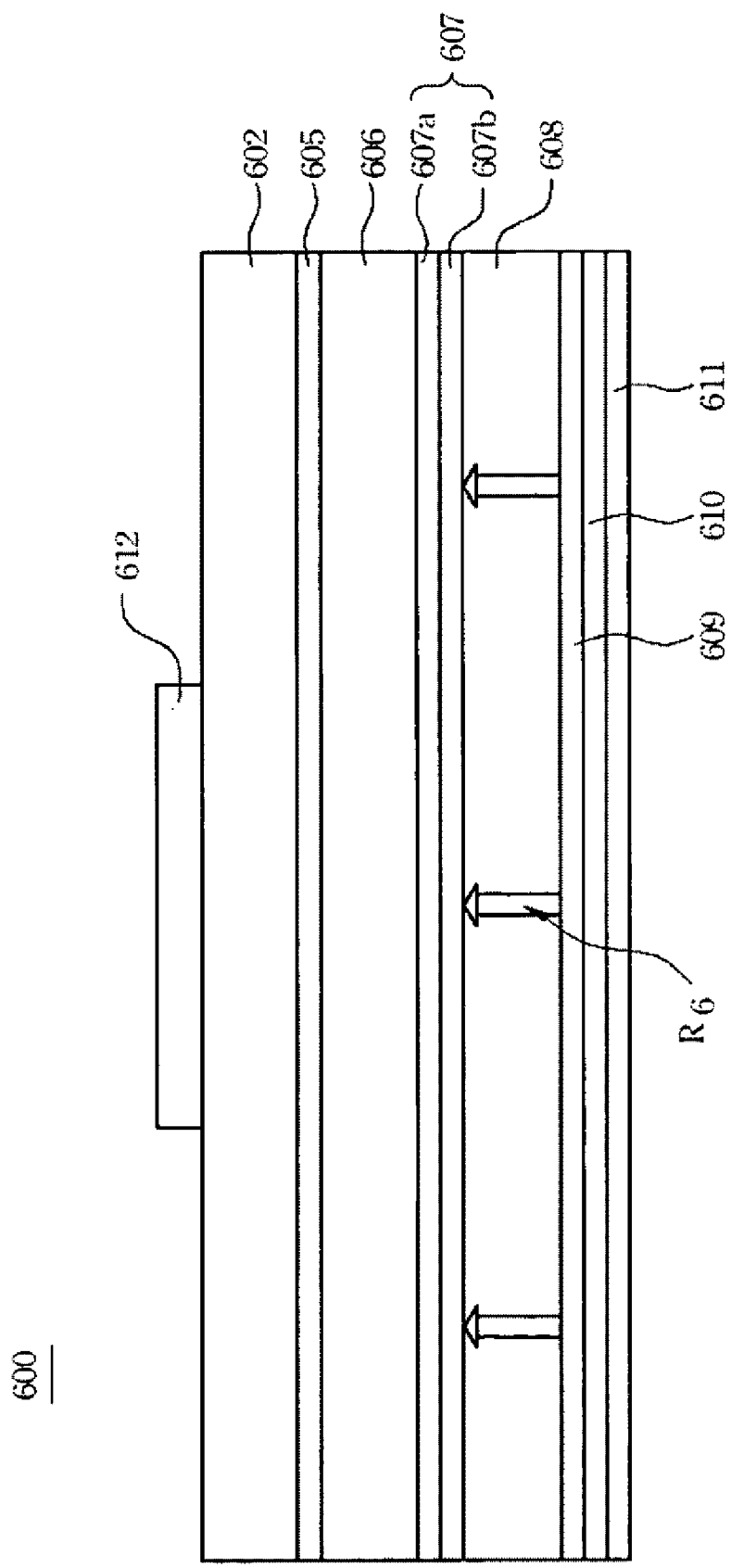

Referring to FIGS. 6A-6C show cross-sectional views of the light-emitting diode device 500 in accordance with the process of a fourth embodiment of the present invention. Referring to FIG. 6A, a growth substrate 601 such as sapphire, SiC, Si, ZnO, MgO, AlN, GaN or the combinations thereof is provided. An n-type semiconductor layer 602 is formed on the growth substrate 601 by metal-organic chemical vapor deposition (MOCVD) process wherein the material to form the n-type semiconductor layer is n-type AlInGaN or n-type GaN. An active layer 605 is epitaxially grown on the n-type semiconductor layer 602, wherein the active layer 605 is a multi-quantum well (MQW) structure formed by AlInGaN or GaN.

A first p-type semiconductor layer 606 is epitaxially grown on the active layer 605. A p-type three-dimensional hole cloud structure 607 is formed on the first p-type semiconductor layer 606. A second p-type semiconductor layer 608 is formed on the p-type three-dimensional hole cloud structure 607. The p-type three-dimensional hole cloud structure 607 is a double heterojunction structure formed by two heterostructure p-type AlInGaN layers, such as a p-type $Al_xIn_yGa_{1-x-y}N$ ($0<x<1$, $0<y<1$) layer and a p-type $Al_aIn_bGa_{1-a-b}N$ ($0<a<1$, $0<b<1$) layer. The bandgap of the p-type $Al_xIn_yGa_{1-x-y}N$ layer is larger than the bandgap of the p-type $Al_aIn_bGa_{1-a-b}N$ layer. In this embodiment, the thickness of the p-type wide bandgap layer $Al_xIn_yGa_{1-x-y}N$ 607*a* or the p-type narrow bandgap layer $Al_aIn_bGa_{1-a-b}N$ 607*b* is between 1 nm to 1000 nm. The material to form the first p-type semiconductor layer 606 is p-type AlInGaN or p-type GaN. The material to form the second p-type semiconductor layer 608 is substantially the same as the first p-type semiconductor layer 606.

Referring to FIG. 6B, a reflecting layer 609 is formed on the second p-type semiconductor layer 608 wherein the material of the reflecting layer is made of Al, Au, Pt, Zn, Ag, Ni, Ge, In, Sn or the combinations thereof; a connecting layer 610 is formed on the reflecting layer 609 wherein the material of the connecting layer is made of silver epoxy, spontaneous conductive polymer, high polymer material with conductive material doping, Al, Au, Pt, Zn, Ag, Ni, Ge, In, Sn, Ti, Pb, Cu, Pd or the combinations thereof. A permanent substrate 611 is provided wherein the material is made of SiC, silicon, ZnO, GaN, metal or the combinations thereof. The permanent substrate 611 and the reflecting layer 609 are connected by the connecting layer 610. In this embodiment, the permanent substrate 611 is a metal substrate, and it can be the metal electrode of the light-emitting diode device 600.

Referring to FIG. 6C, after the removal of the growth substrate 601, another metal electrode 612 is formed on the n-type semiconductor layer 602 to complete the process of the light-emitting diode device 600.

Because the p-type three-dimensional hole cloud structure 607 has plurality of heterojunction structures with different bandgaps, it makes the band bending and the energy splitting under carrier quantization effect in the interface of the wide bandgap material layer and the narrow bandgap material layer. By using the characteristics of high carrier mobility and high carrier concentration in the light-emitting diode device, it can drive the current R6 from the permanent substrate 611 to the active layer of the light-emitting diode device uniformly.

Figure 7A:
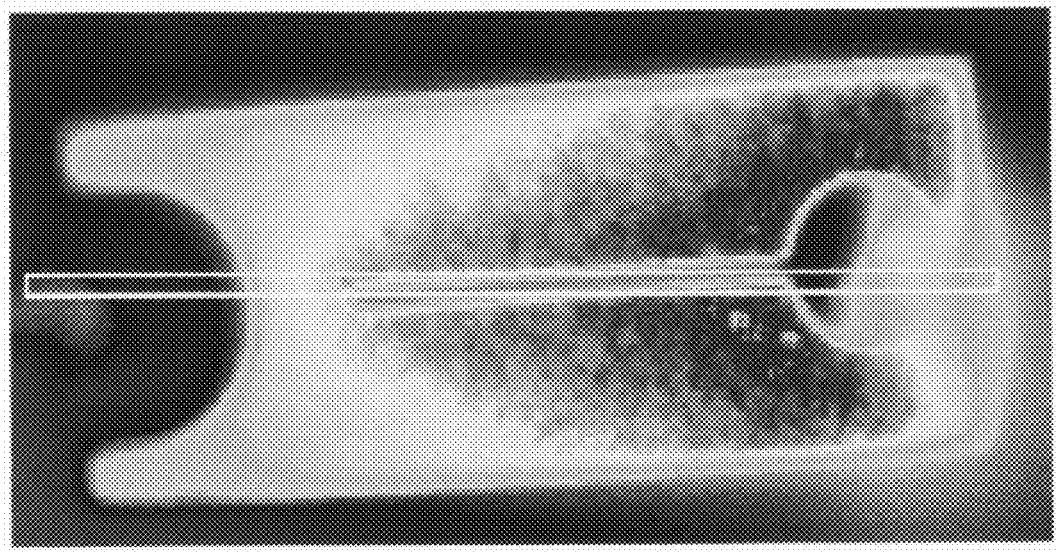
FIG. 7A is a top view illustration of the current spreading of conventional light-emitting diode device.
Figure 7B:
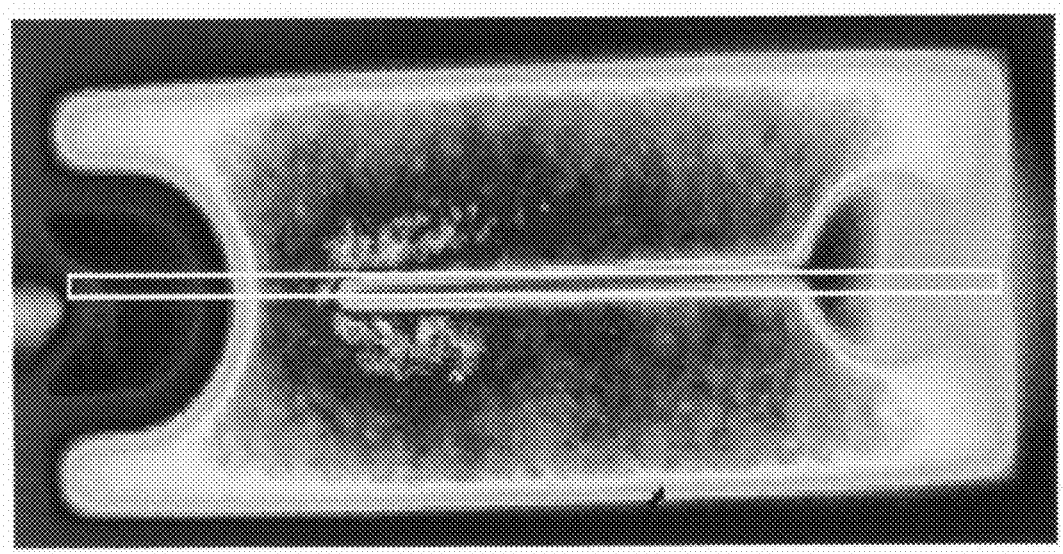
FIG. 7B is a top view illustration of the current spreading of the embodiment of the present invention.

Referring to FIGS. 7A and 7B, FIG. 7A is a top view illustration of the current spreading of the conventional light-emitting diode device. FIG. 7B is a top view of the current spreading with the embodiment of the present invention. FIG. 7A and FIG. 7B show the 20 mA current driven from the front side electrode, such as metal electrode, to the light-emitting diode device. The current spreading of the light-emitting diode device is observed the by the microscope. Comparing to FIGS. 7A and 7B, the light-emitting diode device having the n-type three-dimensional electron cloud structure and the p-type three-dimensional hole cloud structure has better current spreading than the conventional light-emitting element.

According to the embodiments described above, the feature of this invention is to form a p-type three-dimensional hole cloud structure or an n-type three-dimensional electron cloud structure contains at least a wide bandgap material layer and a narrow bandgap material layer in the p-type or n-type semiconductor layer of the light-emitting diode device, wherein each of the p-type three-dimensional hole cloud structure or an n-type three-dimensional electron cloud structure includes heterojunction structures with at least of one wide bandgap material layer and at least of one narrow bandgap material layer.

Because the wide bandgap material layer and a narrow bandgap material layer described above are composed of the group III and V nitride compounds, it has the characteristics of high carrier mobility and high carrier concentration to drive the current from the front side electrode to the active layer uniformly to solve the issues of the current crowding effect in the light-emitting diode device. Using the methods of this invention has the advantages of enhancing the light efficiency of the light-emitting diode device with easy process.

What is claimed is:

1. A light-emitting diode device comprising:
    a substrate;
    a layer structure disposed on the substrate and comprising:
        a first n-type GaN layer;
        an n-type three-dimensional electron cloud structure directly on the first n-type GaN layer, wherein the n-type three-dimensional electron cloud structure comprises an n-type $Al_xIn_yGa_{1-x-y}N$/n-type $Al_aIn_bGa_{1-a-b}N$ ($0<x<1$, $0<y<1$, $0<a<1$, $0<b<1$) layer;
        a second n-type layer disposed on the n-type three-dimensional electron cloud structure;
        an active layer disposed on the second n-type layer; and
        a first p-type layer disposed on the active layer.

2. The light-emitting diode device according to claim 1, further comprising:
    a p-type three-dimensional hole cloud structure disposed on the first p-type layer; and
    a second p-type layer disposed on the p-type three-dimensional hole cloud structure.

3. The light-emitting diode device according to claim 2, wherein the p-type three-dimensional hole cloud structure comprises a wide bandgap material layer and a narrow bandgap material layer, wherein at least one of the wide bandgap material layer and the narrow bandgap material layer comprises p-type doping.

4. The light-emitting diode device according to claim 3, wherein the p-type three-dimensional hole cloud structure is a p-type $Al_xIn_yGa_{1-x-y}N$/p-type $Al_aIn_bGa_{1-a-b}N$ ($0<x<1$, $0<y<1$, $0<a<1$, $0<b<1$) layer, wherein the bandgap of the p-type $Al_xIn_yGa_{1-x-y}N$ layer is larger than the bandgap of the p-type $Al_aIn_bGa_{1-a-b}N$ layer.

5. The light-emitting diode device according to claim 3, wherein the thickness of the wide bandgap material layer or the narrow bandgap material layer is between 1 nm to 1000 nm.

6. The light-emitting diode device according to claim 1, wherein the n-type three-dimensional electron cloud structure comprises a wide bandgap material layer and a narrow bandgap material layer, wherein at least one of the wide bandgap material layer and the narrow bandgap material layer comprises n-type doping.

7. The light-emitting diode device according to claim 6, wherein the bandgap of the n-type $Al_xIn_yGa_{1-x-y}N$ layer is larger than the bandgap of the n-type $Al_aIn_bGa_{1-a-b}N$ layer.

8. The light-emitting diode device according to claim 6, wherein the thickness of the wide bandgap material layer or the narrow bandgap material layer is between 1 mm to 1000 nm.

9. A light-emitting diode device comprising:
    a substrate;
    a layer structure disposed on the substrate and comprising:
        a first n-type GaN layer;
        an active layer disposed on the first n-type GaN layer;
        a first p-type GaN layer disposed on the active layer;
        a p-type three-dimensional hole cloud structure disposed directly on the first p-type GaN layer, wherein the p-type three-dimensional hole cloud structure comprises a p-type AlxInyGa1-x-yN/n-type Ala InbGa1-a-bN ($0<x<1$, $0<y<1$, $0<a<1$, $0<b<1$) layer; and
        a second p-type layer disposed on the p-type three-dimensional hole cloud structure.

10. The light-emitting diode device according to claim 9, wherein the p-type three-dimensional hole cloud structure comprises a wide bandgap material layer and a narrow bandgap material layer, wherein at least one of the wide bandgap material layer and the narrow bandgap material layer comprises p-type doping.

11. The light-emitting diode device according to claim 10, wherein the thickness of the wide bandgap material layer or the narrow bandgap material layer is between 1 nm to 1000 nm.

12. The light-emitting diode device according to claim 9, wherein the bandgap of the p-type $Al_xIn_yGa_{1-x-y}N$ layer is larger than the bandgap of the p-type $Al_aIn_bGa_{1-a-b}N$ layer.

13. The light-emitting diode device according to claim 9, further comprising:

a second n-type layer between the active layer and the first n-type GaN layer; and an n-type three-dimensional electron cloud structure disposed between the first n-type GaN and the second n-type layer.

14. The light-emitting diode device according to claim 13, wherein the n-type three-dimensional electron cloud structure is an n-type $Al_xIn_yGa_{1-x-y}N$/n-type $Al_aIn_bGa_{1-a-b}N$ ($0<x<1, 0<y<1, 0<a<1, 0<b<1$) layer, wherein the bandgap of the n-type $Al_xIn_yGa_{1-x-y}N$ layer is larger than the bandgap of the n-type $Al_aIn_bGa_{1-a-b}N$ layer.

* * * * *